United States Patent
Liu et al.

(10) Patent No.: US 11,887,898 B2
(45) Date of Patent: Jan. 30, 2024

(54) METHOD OF MONITORING SEMICONDUCTOR PROCESS

(71) Applicant: Winbond Electronics Corp., Taichung (TW)

(72) Inventors: Chien-Yen Liu, Taichung (TW); Cheng-Chieh Shen, Taichung (TW); Chung-Hsin Lai, Taichung (TW); Chen-Wei Liao, Taichung (TW)

(73) Assignee: Winbond Electronics Corp., Taichung (TW)

( * ) Notice: Subject to any disclaimer, the term of this patent is extended or adjusted under 35 U.S.C. 154(b) by 357 days.

(21) Appl. No.: 16/827,720

(22) Filed: Mar. 24, 2020

(65) Prior Publication Data

US 2021/0125880 A1 Apr. 29, 2021

(30) Foreign Application Priority Data

Oct. 23, 2019 (TW) ................ 108138303

(51) Int. Cl.
*G01N 21/95* (2006.01)
*H01L 21/66* (2006.01)
*G06T 7/00* (2017.01)

(52) U.S. Cl.
CPC ......... *H01L 22/12* (2013.01); *G01N 21/9503* (2013.01); *G06T 7/0006* (2013.01); *G06T 2207/30148* (2013.01)

(58) Field of Classification Search
None
See application file for complete search history.

(56) References Cited

U.S. PATENT DOCUMENTS

| 2002/0177057 A1* | 11/2002 | Grodnensky ....... G03F 7/70625 430/30 |
| 2011/0054659 A1 | 3/2011 | Carlson et al. |
| 2020/0057388 A1* | 2/2020 | Sun ........................ G03F 7/7065 |
| 2020/0058121 A1* | 2/2020 | Mori ..................... G06T 7/0008 |

FOREIGN PATENT DOCUMENTS

| CN | 101356631 | 1/2009 |
| CN | 101894827 | 11/2010 |
| CN | 101542711 | 4/2011 |
| CN | 106409712 | 2/2017 |

(Continued)

OTHER PUBLICATIONS

"Office Action of Taiwan Counterpart Application", dated Sep. 3, 2020, p. 1-p. 4.

(Continued)

*Primary Examiner* — Mikhail Itskovich
(74) *Attorney, Agent, or Firm* — JCIPRNET

(57) ABSTRACT

A method of monitoring a semiconductor process includes the following steps. A process parameter is set to a first condition. A first process is performed to form a first film layer on a first wafer. The first film layer does not cover a wafer edge region of the first wafer. The first wafer having the first film layer is photographed by an image capturing device to obtain a first wafer image. Image recognition is performed to the first wafer image to obtain first data. Whether a position of the first film layer is offset is determined according to the first data.

12 Claims, 5 Drawing Sheets

(56) References Cited

FOREIGN PATENT DOCUMENTS

| | | |
|---|---|---|
| CN | 106556976 | 4/2017 |
| CN | 107527830 | 12/2017 |
| JP | 2016111300 | 6/2016 |
| TW | 432452 | 5/2001 |
| TW | 540126 | 7/2003 |
| TW | 200635783 | 10/2006 |
| TW | 200820364 | 5/2008 |
| TW | 201633374 | 9/2016 |

OTHER PUBLICATIONS

"Office Action of China Counterpart Application", dated May 23, 2023, p. 1-p. 7.

* cited by examiner

METHOD OF MONITORING SEMICONDUCTOR PROCESS

CROSS-REFERENCE TO RELATED APPLICATION

This application claims the priority benefit of Taiwan application serial no. 108138303, filed on Oct. 23, 2019. The entirety of the above-mentioned patent application is hereby incorporated by reference herein and made a part of this specification.

BACKGROUND

Technical Field

The disclosure relates to a method of a semiconductor process. More particularly, the disclosure relates to a method of monitoring a semiconductor process.

Description of Related Art

In a semiconductor process, the wafer edge region is left blank most of the time. Nevertheless, whether the remained film layer is placed in the central position and the size and evenness of the blank region cannot be effectively monitored.

SUMMARY

The disclosure provides a method of monitoring a semiconductor process through which whether a film layer is placed in a central position and a size and evenness of a blank region are effectively monitored.

The disclosure provides a method of monitoring a semiconductor process, and in the method, a first film layer is formed on a first wafer. The first film layer does not cover a wafer edge region of the first wafer. The first wafer having the first film layer is photographed by an image capturing device to obtain a first wafer image. Image recognition is performed to the first wafer image to obtain first data. Whether a position of the first film layer is offset is determined according to the first data.

To sum up, in the disclosure, the image capturing device performs photographing, and the obtained image is digitalized, so that is is effectively monitored that whether the position of the film layer is placed in the central position, and the size and evenness of the wafer edge blank region are also monitored.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

In a semiconductor process, film flipping may easily occur at wafer edges of some film layers. When a film layer of this type is formed, a shadow ring may be directly disposed in deposition equipment to shadow the wafer edge, and in this way, the film layer is not deposited on the wafer edge. In another manner, a blanket deposition film covering an entire wafer may be formed first, and a film deposited at the wafer edge is then removed, so that a wafer edge region is left blank.

Nevertheless, positions of these film layers in which the wafer edge regions are left blank may be different due to a difference in process parameters of the process. If the process parameters are not appropriately controlled (e.g., a horizontal position or a vertical position at which a wafer is placed and a position of the shadow ring are offset, or a position of a nozzle or a flow amount of edge bead removal equipment), an uneven wafer edge blank may be produced.

Figure 2:
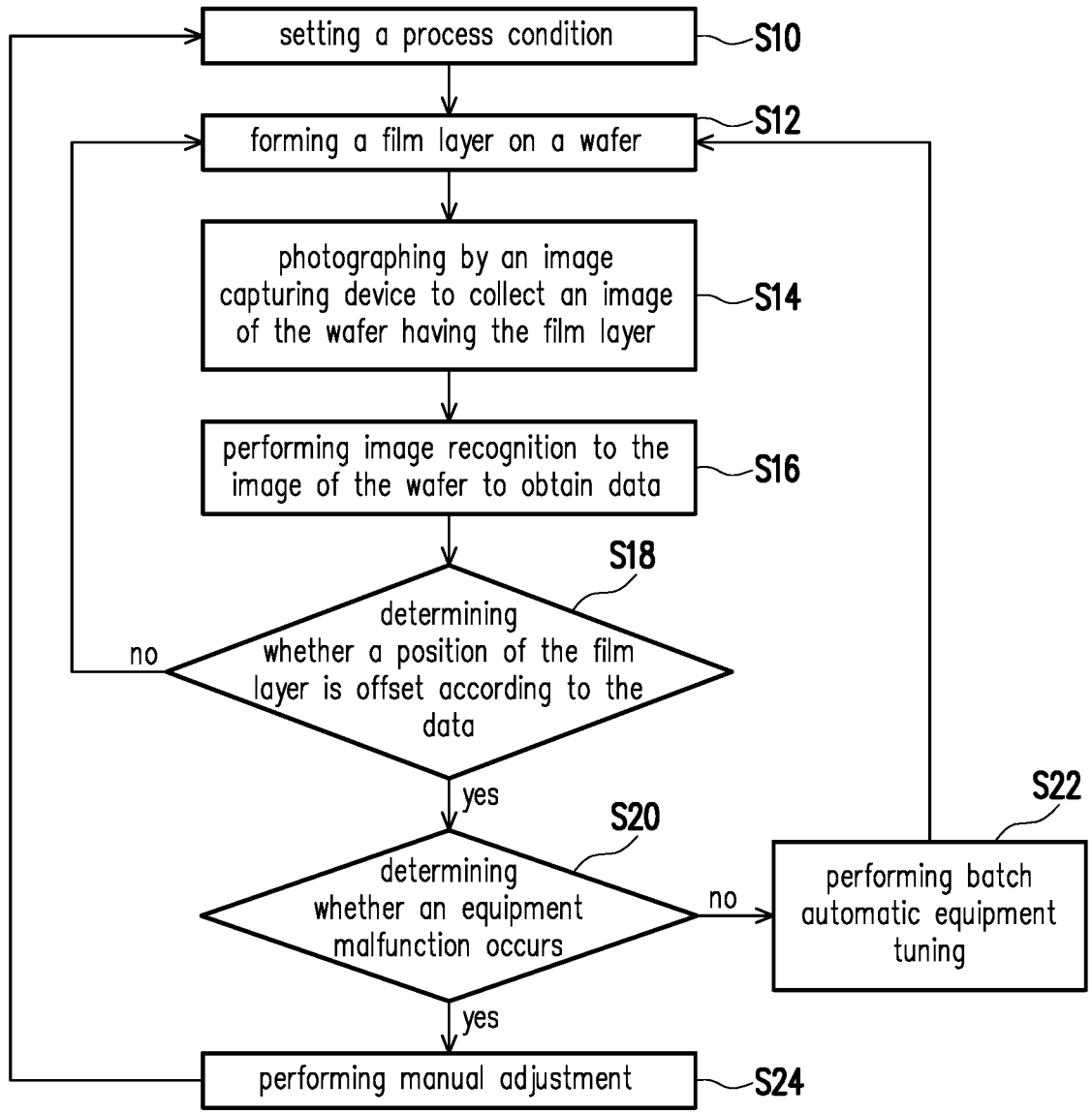
FIG. 2 is a schematic flow chart of a method of monitoring a semiconductor process according to an embodiment of the disclosure.

With reference to FIG. 2, in the embodiment of the disclosure, when steps S10 and S12 are performed, a process parameter is set, and a film layer having a blank wafer edge region is formed on a wafer. Next, step S14 is performed, and an image of the film layer on the wafer is captured through an image capturing device. Step S16 is then performed, and image recognition is performed to the image, so that offset data of a relative position of the film layer and the wafer is obtained. Next, step S18 is performed, whether a position of the film layer is offset may be determined according to the obtained data. If no, the next process of the wafer is performed according to a predetermined condition. If yes, it is determined that whether an equipment malfunction occurs in step S20. If an equipment malfunction does not occur, batch automatic equipment tuning is performed to re-adjust a process condition in step S22. If an equipment malfunction occurs, manual adjustment is performed to re-adjust the process condition. In this embodiment, the image capturing device may be a charge-coupled device (CCD) camera or a complementary metal-oxide-semiconductor camera (CMOS). Image recognition processing of the image may be performed through, for example, a processor of an equipment control system.

With reference to FIG. 1A, FIG. 1B, FIG. 1C, and FIG. 1D, process equipment 100 is, for example, chemical vapor deposition equipment including a plurality of process rooms (or process chambers) 12, 14, and 16, a central transfer room 18, a transfer room 20, and an atmosphere room 22. The process rooms 12, 14, and 16 are, for example, deposition rooms. The central transfer room 18 is coupled to the process rooms 12, 14, and 16 and the transfer room 20. The transfer room 20 is coupled to the central transfer room 18 and the atmosphere room 22. A vacuum level of the central transfer room 18 is greater than a vacuum level of the transfer room 20, and the vacuum level of the transfer room 20 is greater than a vacuum level of the atmosphere room 22.

The process equipment 100 further includes a plurality of robot arms 36. The robot arms 36 includes a vacuum robot arm 30, a transfer robot arm 32, and an atmosphere robot arm 34 respectively disposed in the central transfer room 18, the transfer room 20, and the atmosphere room 22.

A wafer 10 is generally placed in a wafer carrier 24 before entering deposition equipment. The wafer carrier 24 is a typical member configured to store, transport, and process the semiconductor wafer 10. In this embodiment, the process equipment 100 further includes an image capturing device 60. The image capturing device 60 may be installed in the central transfer room 18, the transfer room 20, or the atmosphere room 22. In some embodiments, the image capturing device 60 may be installed on the robot arms 36 (for example, installed directly above the vacuum robot arm 30, the transfer robot arm 32, or the atmosphere robot arm 34). The image capturing device 60 may also be installed in a region outside the process equipment 100.

Figure 1A:
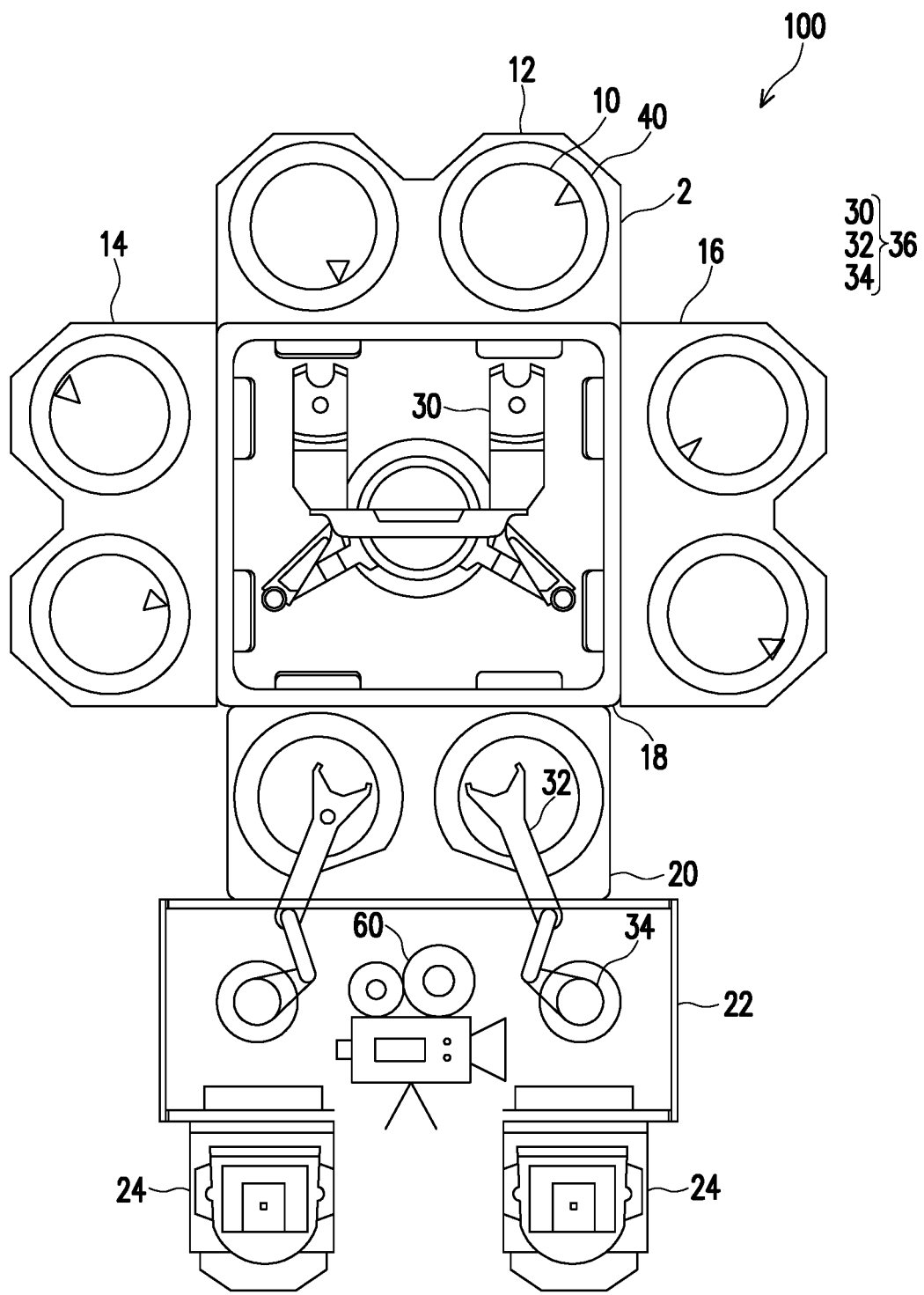
FIG. 1A is a schematic view of process equipment according to an embodiment of the disclosure.

With reference to FIG. 1A and FIG. 2, a process condition is set in step S10. Various parameter settings of the process equipment 100 are set to a first condition before a deposition process is performed. According to the set first condition, the wafer 10 is taken out from the wafer carrier 24 by the atmosphere robot arm 34 in the atmosphere room 22 and then is transferred to the vacuum robot arm 30 through the transfer robot arm 32. The wafer 10 is then placed in the process room 12 by the vacuum robot arm 30.

Figure 1B:
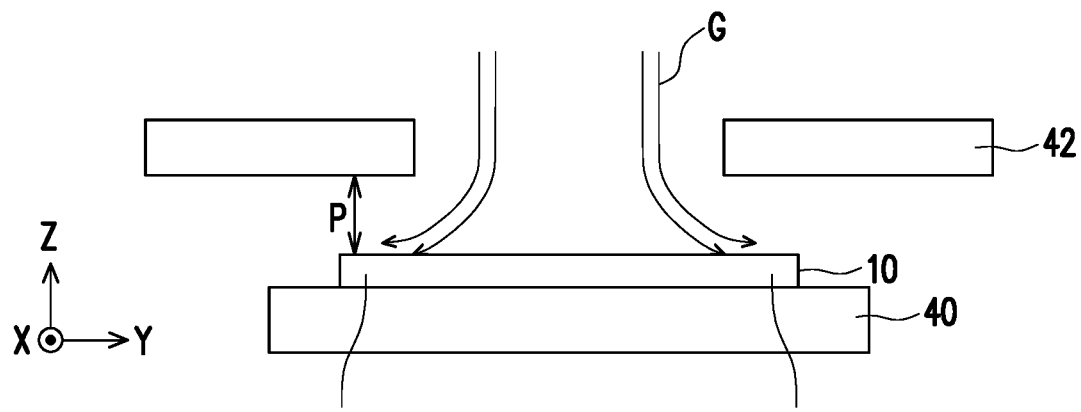
FIG. 1B is a schematic local cross-section view illustrating a process room of FIG. 1A.

With reference to FIG. 1A and FIG. 1B, in this embodiment, a carrying platform 40 and a corresponding shadow ring 42 are disposed on a chamber wall of each of the process rooms 12, 14, and 16. The shadow ring 42 is correspondingly disposed in a wafer edge region ER of the wafer 10 on the carrying platform 40.

With reference to FIG. 1B and FIG. 2, in step S12. a film-forming process is performed in the process room 12 according to the set first condition. A film layer 50 which is not shadowed by the shadow ring 42 is formed on the wafer 10, and the film layer 50 is not formed on the wafer edge region ER which is shadowed by the shadow ring 42, so that the wafer edge region ER is left blank. A material of the film layer 50 may be, for example, silicon carbide, silicon nitride, or silicon oxide.

Figure 1C:
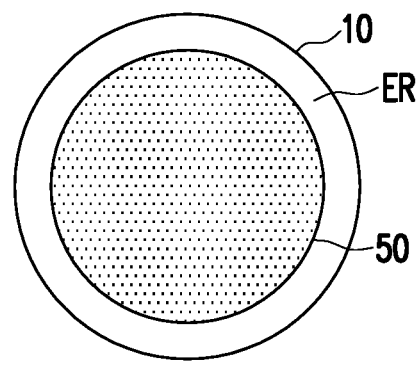
FIG. 1C is a schematic view illustrating a wafer image having an even blank region.
Figure 1D:
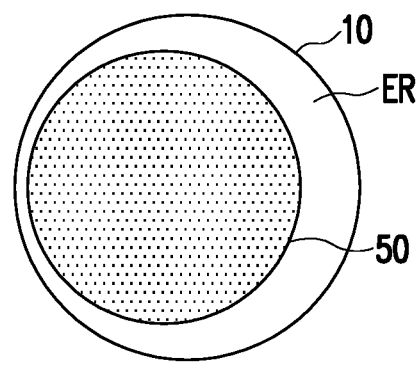
FIG. 1D is a schematic view illustrating a wafer image having an uneven blank region.

With reference to FIG. 1B and FIG. 1D, a size of a gap P may influence a size of an air flow field G, so that an area of the film layer 50 and an area of a blank region of the wafer edge region ER are further influenced. The size of the gap P may be controlled through adjusting a height (Z axis) of the carrying platform 40. Further, if the carrying platform 40 is tilted horizontally, the gap P between the wafer 10 and the shadow ring 42 may change, so that a position of the film layer 50 is offset or a size or a contour of the film layer 50 may not meet expectation.

With reference to FIG. 1A, FIG. 1C, FIG. 1D, and FIG. 2, after the film layer 50 is formed in the process room 12, the wafer 10 is taken out from the process room 12 through the vacuum robot arm 30. In step S14, the wafer 10 is photographed by using the image capturing device 60, so that an image of the wafer having the film layer 50 (abbreviated to wafer image) is obtained. The image capturing device 60 may perform photographing directly from above the wafer 10 or may photograph the wafer 10 from a specific angle, so that a top view image or an image of a specific angle of the wafer 10 having the film layer 50 is obtained.

Figure 3:
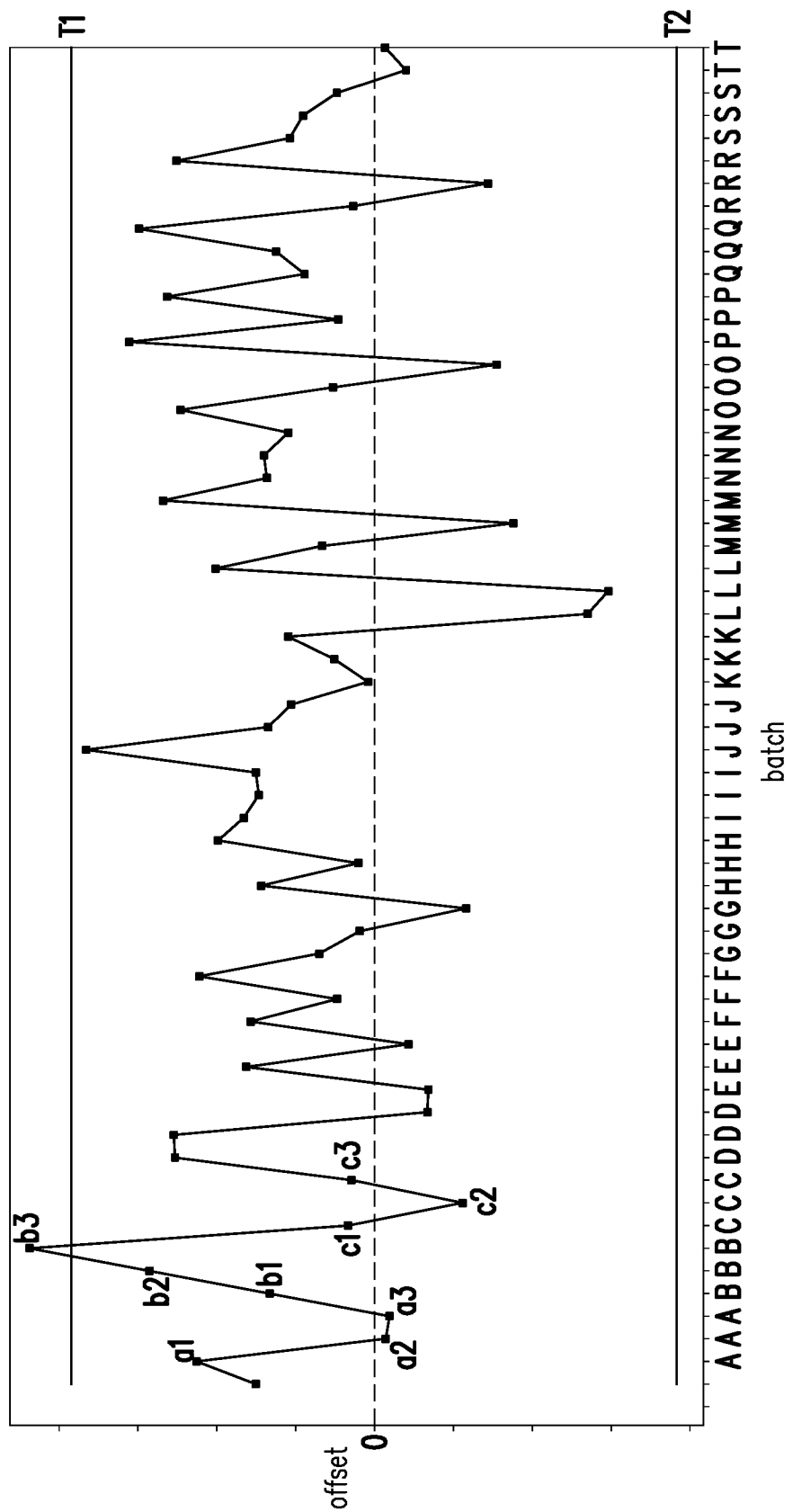
FIG. 3 is an X-axis static process control diagram according to an embodiment of the disclosure.

With reference to FIG. 1C, FIG. 1D, and FIG. 2, in step S16, after image recognition is performed to the wafer image obtained by the image capturing device 60 through the processor, data of a relative position of the film layer 50 and the wafer 10 on the wafer image may thus be obtained. In step S18, the processor may determine whether the position of the film layer 50 on the wafer 10 is offset according to the obtained data. In some embodiments, the processor may perform a generation process including generation of a static process control diagram. The static process control diagram (as shown in FIG. 3) is generated through an offset of a center of the film layer 50 and an offset of a center of the wafer 10 on the X axis and the Y axis. In addition, after the image capturing device 60 obtains the wafer 10 on which the film layer 50 is deposited, a defect map system may be used together to draw a contour of the film layer 50 on the wafer 10. In this way, it may be determined that the offset of the film layer 50 is an X-axis offset or a Y-axis offset.

The static process control diagram may include an X-axis static process control diagram (as shown in FIG. 3) and a Y-axis static process control diagram (not shown). Data and predetermined threshold ranges in the X-axis static process control diagram and the Y-axis static process control diagram may be used to determine the position and a degree of offset of the film layer 50 on the wafer 10 on the X axis and the Y axis. An ideal offset of the film layer 50 is 0.

As shown in FIG. 2 and FIG. 3, when a collected data value falls within ranges of predetermined thresholds T1 and T2, it means that normal operation is provided, the film layer 50 is located in a central position, and the wafer edge region has an even blank region, as shown in FIG. 1C. In this way, step S12 is performed, and the film layer forming process may continue to be performed to the next wafer 10 according to the original first condition. When the collected data value exceeds the ranges of the predetermined thresholds T1 and T2, it means that a positional offset is intolerable, the film layer 50 is not located in the central position, and the blank region of the wafer edge region is uneven, as shown in FIG. 1D.

FIG. 3 is an X-axis static process control diagram. The control diagram refers to X-axis offsets of three wafers in each batch. In FIG. 3, a point a1, a point a2, and a point a3 refer to X-axis offsets of deposited films on three wafers in a same wafer batch A. Values of the point a1, the point a2, and the point a3 all fall within the ranges of the predetermined thresholds T1 and T2, it means that normal operation is provided, so that a deposition process may continue to be performed to a next batch B according to a condition of the batch A. In FIG. 3, a point b1, a point b2, and a point b3 refer to X-axis offsets of deposited films on three wafers on the X axis in the batch B. Values of the point b1 and the point b2 fall within the range of the predetermined threshold T1. A value of the point b3 exceeds the range of the predetermined threshold T1, and it means that a malfunction occurs, and that a deposition process may not continue to be performed to a next batch C according to a process condition of the batch B.

Each of the X-axis static process control diagram and the Y-axis static process control diagram includes image data of multiple deposition processes in the same process room. That is, the image data refer to data of the wafer image of the wafer 10 having the film layer 50 and on which the deposition process is performed. A tendency of the positional offset of the film layer 50 on the wafer 10 may be determined according to the current data and the previous data. When the data show that the positional offset tends to occur in a same direction, a malfunction may still occur even the data value does not exceed the ranges of the predetermined thresholds T1 and T2. For instance, continuous rising or continuous declining represents a tendency of a malfunction which is "about" to occur, and that an early warning of the malfunction may be provided through the tendency.

With reference to FIG. 2, in step 20, when the collected data value exceeds the predetermined threshold range, it means that the positional offset exceeds the range, and the equipment control system may determine whether an equipment malfunction occurs (HW issue) according to the collected data value.

With reference to FIG. 2, in step S22, if an equipment malfunction does not occur, the equipment is not required to be stopped, and the system may perform batch (run to run) automatic equipment tuning. In the batch automatic equipment tuning, the process condition of the system may be adjusted from the first condition to a second condition, and the deposition process may then be continuously performed to the next wafer, so that the wafer edge region has an even blank region. Factors adjusted and calibrated in the batch automatic equipment tuning includes a program (recipe), an equipment parameter (EC), and a robot arm transfer offset, so as to adjust and calibrate offsets of the height (Z axis) of the carrying platform 40, a level of the carrying platform 40, a flow distribution, a plasma distribution, the shadow ring 42, and so on. For instance, after the robot arm is tuned, the wafer may be transferred to a more favorable position in the process room 12.

With reference to FIG. 2, in step S24, if an equipment malfunction occurs, the equipment is stopped first, and manual equipment tuning is then performed. The process condition of the system is re-adjusted from the first condition to another second condition, and the deposition process of the next wafer 10 is then continuously performed. After the deposition process based on the another second condition is completed, an offset may be converted through a CCD and then fed back to the next wafer through the offset. The another second condition may be configured to correct or compensate for the offset caused by the first condition. In this way, the position of the deposited film subsequently formed may be corrected to fall within the predetermined threshold range. That is, the deposited film may be located in the central position, so that the wafer edge region may have an even blank region.

In the above embodiment, the processor of the equipment control system may calculate and obtain the offset data of the relative position of the film layer 50 and the wafer 10 on the image first and then compare the data with the predetermined threshold. Nevertheless, in other embodiments, the photographed image may directly be compared with a controlled image (e.g., the wafer image of FIG. 1C) without a film layer offset stored in the processor.

Figure 4:
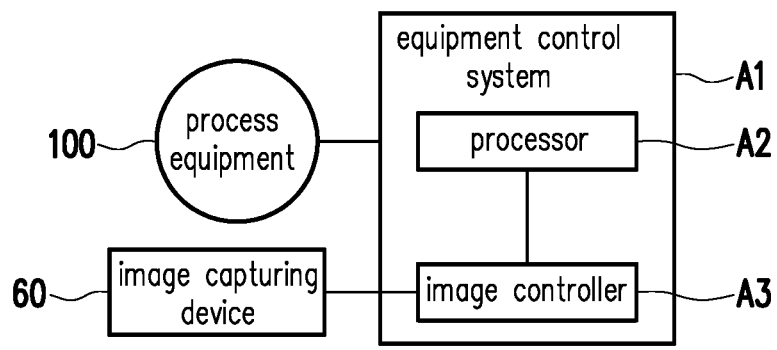
FIG. 4 is a schematic block diagram illustrating an equipment control system.

FIG. 4 is a schematic block diagram illustrating an equipment control system. With reference to FIG. 4, an equipment control system A1 basically may be configured to control all control processes of process equipment. The equipment control system A1 at least includes a processor A2, an image controller A3, and other control modules of various parts and the like. The image controller A3 is connected to the external image capturing device 60 and is configured to control all operations of the image capturing device 60. The equipment control system A1 may include various control modules and may control parts (e.g., the process room, the robot arm, the nozzle of the edge bead removal equipment, etc.) of the process equipment, that is, the equipment control system A1 may perform a series of control processes to the process equipment. Finally, after the film layer 50 is deposited on the wafer 10 by the process equipment, the wafer 10 on which the film layer 50 is deposited is removed to a predetermined position (i.e., the position where photographing is to be performed).

Next, the processor A2 of the equipment control system A1 may set the image controller A3 to transmit a control command to the image capturing device 60, so as to set the image capturing device 60 to photograph the wafer 10 on which the film layer 50 is deposited. The photographed wafer image is then transmitted back to the image controller A3. The processor A2 then performs image recognition to the image, so as to obtain the offset data of the relative position of the film layer 50 and the wafer 10 on the wafer image.

The processor A2 may perform a process of generating the static process control diagram based on the above data. In this way, the static process control diagram obtained through the photographed images of multiple wafers is obtained and is externally outputted, for example, is outputted to a display of the equipment control system A1 or is printed out through a printing device for an operator.

In the disclosure, the image capturing device performs photographing, and the obtained image is digitalized through the processor, so that it is monitored that whether the positional offset of the film layer having the wafer edge blank is tolerable. The film layer having the wafer edge blank may be the deposited film obtained by performing deposition after being shadowed by the shadow ring in the foregoing embodiment. Nevertheless, the disclosure is not limited thereto. The film layer having the wafer edge blank may also be the deposited film originally covering the entire wafer. Part of the deposited film of the wafer edge region is then removed through a subsequent removal process, so that the wafer edge is left blank. The deposited film is, for example, a copper layer.

Figure 5A:
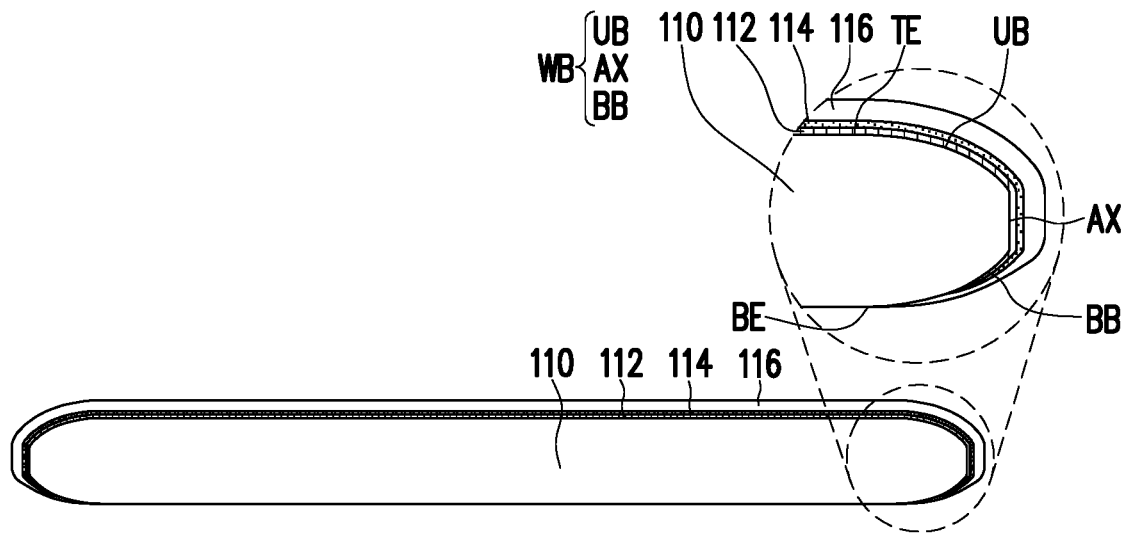
FIG. 5A and FIG. 5B are schematic cross-sectional views of a method of fabricating a semiconductor film layer according to another embodiment of the disclosure.

With reference to FIG. 5A, for example, a barrier layer 112 is formed on the wafer 10 before a copper plating process is performed most of the time. The barrier layer 112 may be single-layered or multiple-layered and may be made of, for example, tantalum, titanium, tantalum nitride, titanium nitride, etc. Next, a seed layer 114 is formed on the barrier layer 112. A material of the seed layer 114 is, for example, copper. The copper plating process is then performed, so that a copper layer 116 is formed on the seed layer 114.

In the plating process, the copper layer 116 is not only plated on a surface of the wafer 110 but also plated on a wafer bevel WB of the entire wafer 110, that is, extending from a wafer top edge TE, an upper bevel UB, and an apex AX of the wafer to a bottom bevel BB and then to a wafer bottom edge BE of the wafer. Nevertheless, the barrier layer 112 and the seed layer 114 do not cover the entire wafer bevel WB of the wafer 110. Part of the bottom bevel BB of the wafer 110 may not be covered by the barrier layer 112 nor the seed layer 114. Therefore, the copper layer 116 at the bottom bevel BB is not formed on the barrier layer 112 and is in direct contact with the wafer 110 at the bottom bevel BB instead, an undercutting may also be observed. Since poor adhesion is provided between the copper layer 116 and the wafer 110, the film may be flipped without the barrier layer 112 most of the time, or the equipment may be contaminated by copper.

Figure 5B:
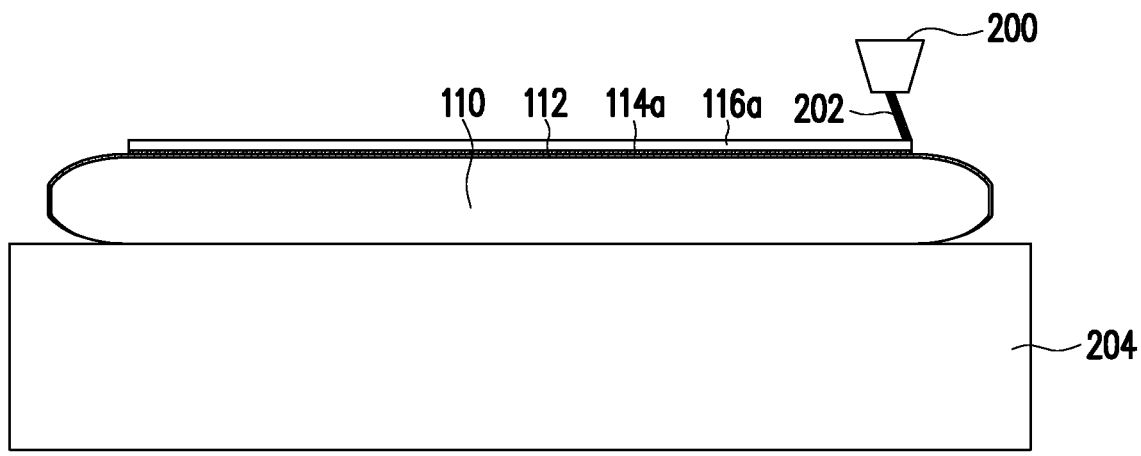

Therefore, with reference to FIG. 5B, before the copper plating process is performed, an edge bead removal (EBR) is performed. In an edge bead removal process, the wafer 110 may be transferred to edge bead removal equipment in an edge bead removal room. An etching agent 202 is sprayed by a nozzle 200 of the edge bead removal equipment from inside to the outside. In this way, the copper layer 116 and the seed layer 114 at the wafer bevel WB of the wafer 110 are removed, and that the barrier layer 112 at the wafer bevel WB of the wafer 110 is exposed, and a cooper layer 116a and a seed layer 114a are remained. If the edge bead removal is performed over an excessively wide area, or positions of the wafer 110, the carrying platform 204, and the nozzle 200 of the edge bead removal equipment are offset, an entire die may be damaged. It thus can be seen that it is important to control a process condition of the edge bead removal equipment.

In this embodiment, after the barrier layer 112, the seed layer 114, and the copper layer 116 are formed on the wafer 110, the following process may be performed by adopting the method of FIG. 2.

With reference to FIG. 2 and FIG. 4, in step S10, a process condition is set. Before the edge bead removal process is performed, various parameters of the equipment 100 (e.g., the edge bead removal equipment) are set to the first condition. The parameters include, for example, the recipe, the equipment parameter (EC), and the robot arm transfer offset, so as to adjust and calibrate the height (Z axis) of the carrying platform 204 carrying the wafer, the level of the carrying platform 204, an air flow amount, a process pressure, temperature, and so on. In step S12, according to the set first condition, the wafer 110 is placed onto the carrying platform 204 in the process room by the robot arm, and the copper layer 116 at the wafer bevel WB of the wafer 110 is removed through the edge bead removal equipment.

After the edge bead removal process is performed in the process room, the wafer is taken out from the process room through the robot arm. With reference to FIG. 2, in step S14, the wafer is photographed through the image capturing device 60, so that an image of the wafer (abbreviated to wafer image) having film layers (the barrier layer 112, the seed layer 114, and the copper layer 116) is collected.

With reference to FIG. 2, in step S16, after the wafer image having the film layers (the barrier layer 112, the seed layer 114, and the copper layer 116) is collected through the image capturing device 60, the photographed wafer image is transmitted back to the image controller A3 of the equipment control system A1. After image recognition is performed to the wafer image obtained by the image capturing device 60 through the processor A2 of the equipment control system A1, the data of the relative position of the film layer 50 and the wafer 10 on the wafer image may thus be obtained.

With reference to FIG. 2, in step S18, the processor A2 may determine whether the position of the film layer (the copper layer 116) on the wafer is offset according to the obtained data. If no positional offset occurs, it means that normal operation is provided. Step S12 is thus performed, and the edge bead removal process may continue to be performed to the next wafer according to the original first condition. If a positional offset occurs, it means that a malfunction occurs, and the equipment control system may determine whether an equipment malfunction occurs according to the collected data value.

With reference to FIG. 2, in step S22, if an equipment malfunction does not occur, the system may perform the batch automatic equipment tuning. The process condition of the system is adjusted from the first condition to the second condition, and the deposition process is then continuously performed to the next wafer. The factors adjusted and calibrated in the batch automatic equipment tuning includes the recipe, the equipment parameter (EC), and the robot arm transfer offset, so as to adjust and calibrate offsets of the height (Z axis) of the carrying platform 204, the level of the carrying platform 204, the air flow amount, the process pressure, and temperature and so on.

With reference to FIG. 2, in step S24, if an equipment malfunction occurs, the manual equipment tuning is performed. The process condition of the system is re-adjusted from the first condition to the second condition, so that the offset caused by the first condition is corrected or compensated, and the edge bead removal process is then continuously performed to the next wafer. In this way, the offset of the position of the film layer of the next wafer is corrected to fall within the predetermined threshold range.

In the disclosure, the image capturing device performs photographing, and the obtained image is digitalized through the processor, so that is is effectively monitored that whether the position of the film layer of the wafer edge blank is placed in the central position, and the size and evenness of the wafer edge blank region are also monitored. If the position of the film layer is offset, it may be further determined that whether such offset is caused by an equipment malfunction. If no equipment malfunction occurs, the batch automatic equipment tuning may be performed. On the contrary, if an equipment malfunction occurs, the manual equipment tuning is performed. In addition, monitoring and equipment tuning may be instantly performed, the positional offset of the film layer may be instantly corrected, so that the film layer of the next wafer may be placed in the central position and may has an even blank region.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A method of monitoring a semiconductor process, comprising:
   setting a process parameter to a first condition;
   performing a first process to form a first film layer on a first wafer, wherein the first film layer does not cover a wafer edge region of the first wafer;
   before performing a patterning process, photographing the first wafer having the first film layer by a camera to obtain a first image, wherein the first image comprises a wafer image and a first film image, and the first film image covers an entire center region of the wafer image;
   performing image recognition to the first image to obtain a first data regarding to the wafer and the first film, wherein the first film covers an entire center region of the wafer;
   determining whether a position of the first film layer is offset according to the first data;
   determining whether an equipment malfunction occurs when the position of the first film layer is offset;
   performing a batch automatic equipment tuning to re-adjust the first condition when equipment malfunction does not occur, wherein a factor adjusted and calibrated in the batch automatic equipment tuning includes a robot arm transfer offset; and
   performing a manual adjustment to re-adjust the first condition when equipment malfunction occur.
2. The method of monitoring a semiconductor process as claimed in claim 1, wherein the camera includes a charge-coupled device camera or a complementary metal-oxide-semiconductor camera.

3. The method of monitoring a semiconductor process as claimed in claim 1, wherein the first data comprises a positional offset on an X axis of the first film layer and a positional offset on a Y axis of the first film layer.

4. The method of monitoring a semiconductor process as claimed in claim 3, further comprising inputting the first data into a static process control diagram.

5. The method of monitoring a semiconductor process as claimed in claim 1, further comprising:
  determining whether a position of the first film layer on the first wafer is offset according to the first data,
  maintaining the process parameter at the first condition when the first data falls within a predetermined threshold range for performing a second process of a second wafer; and
  performing the batch automatic equipment tuning or the manual equipment tuning when the first data exceeds the predetermined threshold range and setting the process parameter to a second condition for performing the second process of the second wafer.

6. The method of monitoring a semiconductor process as claimed in claim 1, wherein the first process comprises arranging the first wafer in chemical vapor deposition equipment having a shadow ring configured for shadowing the wafer edge for performing a deposition process.

7. The method of monitoring a semiconductor process as claimed in claim 6, wherein a material of the first film layer comprises silicon carbide, silicon nitride, and silicon oxide.

8. The method of monitoring a semiconductor process as claimed in claim 1, wherein the first process comprises performing an edge bead removal process to the first wafer having a deposited film.

9. The method of monitoring a semiconductor process as claimed in claim 8, wherein the deposited film comprises a copper plating film or a copper seed layer.

10. The method of monitoring a semiconductor process as claimed in claim 9, further comprising forming a barrier layer on the first wafer before the deposited film is formed.

11. The method of monitoring a semiconductor process as claimed in claim 1, wherein during the photographing the first wafer having the first film layer, the first film is an unpatterned film.

12. The method of monitoring a semiconductor process as claimed in claim 1, wherein the first data comprises an offset between a center of the first film layer and a center of the wafer.

* * * * *